(12) United States Patent
Tiemann

(10) Patent No.: US 6,392,464 B1
(45) Date of Patent: May 21, 2002

(54) WIDE BANDWIDTH CIRCUITS FOR HIGH LINEARITY OPTICAL MODULATORS

(75) Inventor: Jerome J. Tiemann, Schenectady, NY (US)

(73) Assignee: Lockheed Martin Corporation, Maryland, NY (US)

( * ) Notice: Subject to any disclaimer, the term of this patent is extended or adjusted under 35 U.S.C. 154(b) by 0 days.

(21) Appl. No.: 09/395,443

(22) Filed: Sep. 14, 1999

(51) Int. Cl.[7] ................................................. H03K 5/08
(52) U.S. Cl. ...................................... 327/317; 327/308
(58) Field of Search ................................. 327/317, 362, 327/307, 308; 330/149, 9; 359/157, 161, 249; 356/226; 385/1, 2, 4, 15, 140

(56) References Cited

U.S. PATENT DOCUMENTS

| | | | | |
|---|---|---|---|---|
| 5,132,639 A | * | 7/1992 | Blauvelt et al. | 330/149 |
| 5,227,736 A | * | 7/1993 | Tucker et al. | 330/149 |
| 5,282,072 A | * | 1/1994 | Nazarathy et al. | 359/157 |
| 5,347,529 A | * | 9/1994 | Noe | 330/149 |
| 5,428,314 A | * | 6/1995 | Swafford et al. | 327/317 |

\* cited by examiner

Primary Examiner—Matthew Smith
Assistant Examiner—Paul Dinh
(74) Attorney, Agent, or Firm—Scully, Scott Murphy & Presser

(57) ABSTRACT

Wide bandwidth compensating circuits are disclosed for compensating for the nonlinearity of other circuits placed in cascade therewith over a relatively wide bandwidth, particularly for high linearity optical modulators, in which first and second versions of a signal are generated having different gains and different nonlinear distortions. The first signal has a higher gain with a lower distortion. The second signal has a lower gain with a higher distortion, and is subtracted from the first larger amplitude signal to form an output signal having a desired nonlinear transfer characteristic over a relatively wide frequency range. A first exemplary circuit has a first higher gain path and a second lower gain path having a transfer characteristic with a substantially greater amount of negative cubic distortion. The first and second signals are subtracted in a wide band differential amplifier to form a resultant signal having a desired positive cubic distortion. Second and third exemplary circuits are also disclosed.

8 Claims, 2 Drawing Sheets

WIDE BANDWIDTH CIRCUITS FOR HIGH LINEARITY OPTICAL MODULATORS

BACKGROUND OF THE INVENTION

1. Field of the Invention

The present invention relates generally to wide bandwidth compensating circuits for compensating for the nonlinearity of other circuits placed in cascade therewith over a relatively wide bandwidth, and more particularly pertains to such wide bandwidth compensating circuits for providing high linearity optical modulators, such as Mach-Zehnder interferometer modulators. In the compensating circuit, first and second versions of a signal are generated having different gains and different nonlinear distortions. The first version signal has a higher gain with lower distortion. The second version signal has a lower gain with higher distortion, and is combined with the first signal to form a resultant signal which effectively cancels the nonlinearity of a circuit placed in cascade therewith.

2. Discussion of the Prior Art

Circuits for canceling distortion often operate well only over a relatively limited narrow bandwidth, primarily because of reactive components therein. This causes the distortion to become frequency dependent.

A popular prior art approach for designing a circuit with a predetermined nonlinearity transfer characteristic uses a plurality of diodes, each of which connects a signal node to a voltage source through a predetermined resistance. As the signal voltage changes, and the diodes transition from reverse to forward bias (or vice versa), the effective impedance of the signal node changes, thereby producing the desired nonlinearity.

SUMMARY OF THE INVENTION

Accordingly, it is a primary object of the present invention to provide wide bandwidth compensating circuits with predetermined nonlinear characteristics to compensate for the nonlinearity of circuits placed in cascade therewith, particularly to achieve high linearity optical modulators.

A further object of the subject invention is the provision of such wide bandwidth compensating circuits in which first and second versions of a signal are generated having different gains and different nonlinear distortions. The first signal has higher gain with lower distortion. The second signal has lower gain with a higher distortion, and the first and second signals are combined to form a resultant signal having a predetermined nonlinear characteristic. The combination of the nonlinear characteristic of the compensating circuit and the nonlinear characteristic of the circuit in cascade produces a combined substantially linear response over a wide bandwidth.

DESCRIPTION OF THE DRAWINGS

The foregoing objects and advantages of the present invention for wide bandwidth circuits for high linearity optical modulators may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION

Recognizing that a commonly encountered type of distortion (and indeed the specific distortion encountered in optical modulators) is a decrease in gain for large amplitude signals in comparison to the gain for small amplitude signals, it would be desirable to design a gain stage compensating circuit having a compensating nonlinearity transfer characteristic in which larger amplitude signals are amplified relatively more than smaller amplitude signals. This compensating gain stage is then cascaded in series with the optical modulator (or other stages).

For example, a Mach-Zehnder interferometer modulator has a transfer characteristic of a sine wave, and accordingly it would be desirable to combine the modulator with a compensating circuit stage possessing an arc-sine transfer characteristic. To a first approximation, since the sine wave of the interferometer modulator has a negative cubic distortion, $(Sin(X) \approx X - \frac{1}{6}X^3 + \ldots)$, the transfer characteristic of the desired distortion of the compensating circuit should have a positive cubic distortion.

From a mathematical perspective, if two stages are in cascade, and the first stage has a transfer characteristic given by $Y = AX + BX^3$, and the second stage has a transfer characteristic given by $Z = CY + DY^3$, then the overall transfer characteristic is obtained by multiplying the two transfer characteristics, and is $Z = ACX + (AD+BC)X^3$ (plus higher order terms). Thus, if B and D have opposite signs while A and C have the same sign, then the cubic distortion will cancel if the magnitude of AD equals that of BC. For the case at hand, the desired (unit gain) transfer characteristic is $Y = X + \frac{1}{6}X^3$.

Linearizing an optical modulator is particularly important because first, the modulator linearity is very poor to begin with, and secondly, the bandwidth of the system using the modulator may encompass the third harmonic of at least one signal presented to the modulator.

Figure 1:
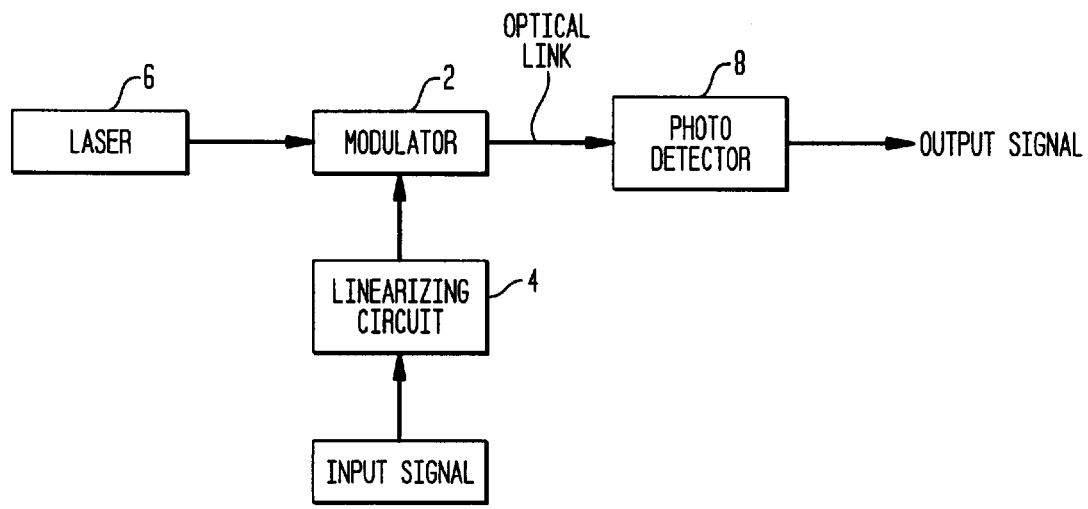
FIG. 1 is a block diagram of an optical modulator wherein an input signal thereto is first directed through a linearizing/compensating circuit pursuant to the present invention.

FIG. 1 is a block diagram of an optical modulator 2 wherein an input signal thereto is first directed through a linearizing/compensating circuit 4 pursuant to the present invention. As is well known in the art, a laser 6 produces a laser beam which is introduced into the optical modulator 2 along with the input signal. A light output of the optical modulator 2 is detected by a photodetector 8 to produce an output signal therefor.

Figure 2:
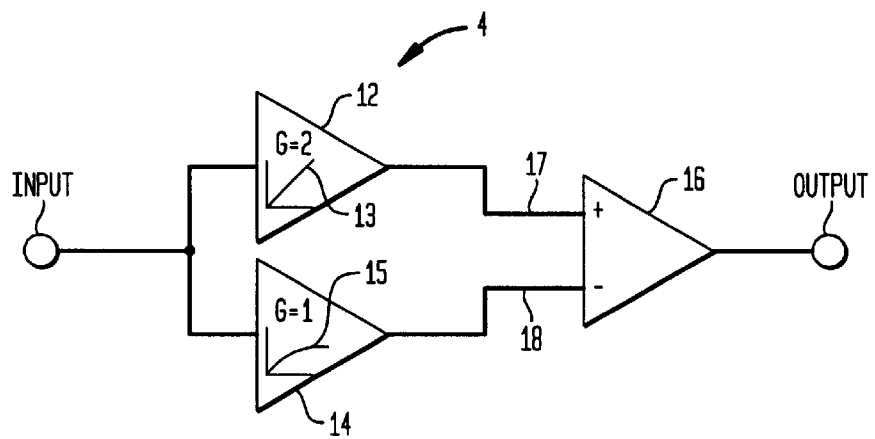
FIG. 2 is a schematic illustration of a first exemplary generic circuit pursuant to the teachings of the present invention which has a first higher gain path having a transfer characteristic with a low (or nonexistent) cubic distortion, and a second lower gain path having a transfer characteristic with a substantially greater amount of negative cubic distortion. The first and second signals are subtracted in a wide band differential amplifier to form a resultant output signal having a desired positive cubic distortion.

FIG. 2 is a schematic illustration of a first exemplary generic linearizing/compensating circuit 4 pursuant to the teachings of the present invention having a first higher gain path 12 with a transfer characteristic 13 with a low (or nonexistent) cubic distortion, and a second lower gain path 14 having a transfer characteristic 15 with a substantially greater amount of negative cubic distortion. The output signals from these different gain paths are then combined, as by being subtracted in a wide band differential amplifier 16 having a positive input terminal 17 and a negative input terminal 18 to form a resultant output signal having the desired positive cubic distortion.

Since the amplitude of the first signal at the positive input terminal 17 is larger than the amplitude of the second signal at the negative input terminal 18, the overall gain of the circuit 4 will be positive, but since the distortion at the second negative terminal 18 is larger than the distortion at the first positive input terminal 17, the distortion appears at the output with an inverted sign to produce the desired positive cubic distortion.

For example, if the gain G of the first low distortion path 12 is 2, and its distortion is zero, and the gain G of the second high distortion path 14 is 1, then the output signal resulting from the subtraction at 16 will have a gain of unity and the opposite distortion.

In practical embodiments, the relative gains of the amplifiers 12 and 15 could be adjustable to more accurately tune the amount of nonlinearity provided by the linearizing/compensating circuit of FIG. 2, to be the opposite to the nonlinearity provided by the circuit connected in cascade therewith.

Figure 3:
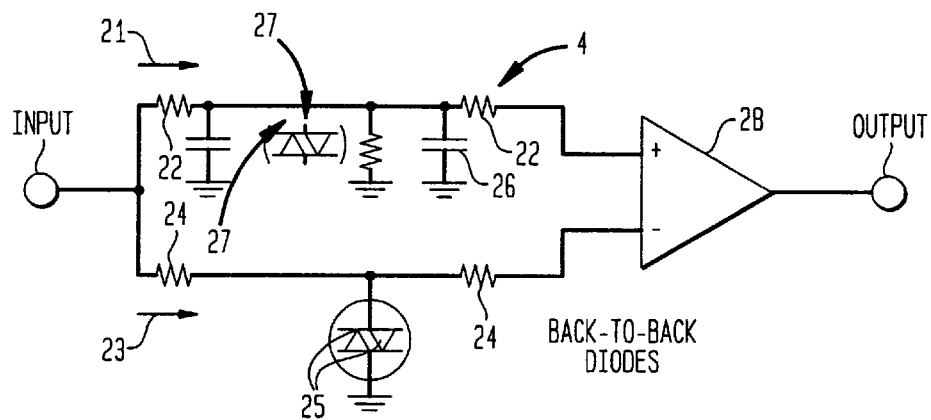
FIG. 3 illustrates a second more specific exemplary embodiment of a circuit pursuant to the present invention having a first low distortion path with a pure resistive attenuator, and a second lower gain distorting path with an attenuator with a pair of Schottke diodes shunting the signal to ground. The reactive components in the two signal paths are carefully balanced such that their frequency responses track over a very wide range, thereby producing a differential signal which maintains a desired nonlinearity over a broad frequency range.

FIG. 3 illustrates a second more specific exemplary circuit pursuant to the present invention having a first low distortion path 21 with pure resistive attenuator elements 22, and a second lower gain (or attenuation) distorting path 23 with attenuator resistive elements 24 and a pair of Schottke diodes 25 shunting the signal to ground. The first and second signals from the first and second paths 21, 23 are combined by a wide bandwidth differential amplifier 28. As is well known, the diodes 25 conduct more strongly when the voltage across them is large, and conduct very weakly when the voltage thereacross is small. Large amplitude signals will therefore be attenuated more strongly than small amplitude signals.

As is also known, a symmetrical arrangement such as shown in FIG. 3 does not introduce any even order distortions. Thus, the lowest order distortion in the path 23 with the diodes 25 is a negative cubic distortion. One problem with this circuit is the fact that the diodes 25 possess a junction capacitance, and this capacitance modifies the distortion as a function of frequency. For this reason, compensating reactances 26 and 27 have been added to the first path 21 with the resistive attenuators 21. The fixed capacitance 26 compensates for the junction capacitance of the diodes 25 at the nominal operating point, and the variable capacitance 27, which might comprise a pair of reverse biased varactor diodes 27', compensates for the voltage coefficient of the diode 25 junction capacitance.

By carefully balancing the reactive components in the two signal paths, their frequency responses can be made to track over a very wide frequency range, thereby producing a differential signal which maintains the desired nonlinearity over a broader frequency range than can be obtained with a single-ended circuit.

Since many circuit configurations produce negative cubic distortions, many variations of this basic approach are possible. Criteria for selecting among these variations include not only cost, but also the ease and the stability with which the gain and distortion can be controlled. As mentioned above, the frequency region over which the distortion is canceled is also a paramount consideration.

Figure 4:
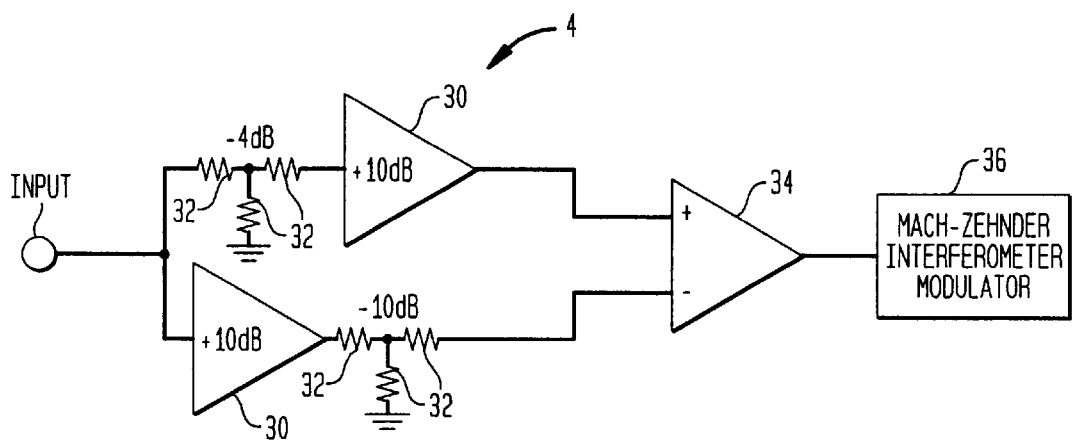
FIG. 4 illustrates a third more specific exemplary embodiment of a circuit pursuant to the present invention which uses identical amplifiers and attenuators in both signal paths, wherein the signal paths differ only with respect to the relative positions of the attenuators with respect to the amplifiers, and the attenuating powers of the attenuators.

FIG. 4 illustrates a third more specific exemplary circuit pursuant to the present invention which uses identical amplifiers 30 and resistive attenuators 32 in both signal paths, which are combined by a wide bandwidth differential amplifier 34. Here, the paths differ only with respect to the relative positions of the attenuators 32 with respect to the amplifiers 30 and the powers of the attenuators. The embodiment of FIG. 3 is a preferred embodiment as it includes no reactive components, and therefore eliminates the frequency dependence of reactive components.

FIG. 4 illustrates the wide bandwidth linearizing/compensating circuit placed in cascade or series with the input to a Mach-Zehnder interferometer modulator 36, such that the positive cubic distortion produced by the circuit compensates for the negative cubic distortion in the optical modulator 36.

In another embodiment, the linearizing/compensating circuit 4 could be placed in cascade with the output of the optical modulator, after the photodetector 8 in FIG. 1.

Moreover, the embodiments of FIGS. 2–4 illustrate a wide bandwidth differential amplifier for combining the first and second signals. Alternative embodiments might generate positive and negative first and second signals with different sign constants (A, B, C, D) which are then added or subtracted together.

While several embodiments and variations of the present invention for wide bandwidth circuits for high linearity optical modulators are described in detail herein, it should be apparent that the disclosure and teachings of the present invention will suggest many alternative designs to those skilled in the art.

What is claimed is:

1. A circuit for producing an output signal with a predetermined nonlinear transfer characteristic over a relatively wide frequency range to compensate for an opposite nonlinear transfer characteristic of a circuit placed in cascade therewith, comprising:

(1). a wide bandwidth circuit having;
  a. a first signal path having a relatively high gain characteristic and a relatively low or no nonlinear distortion characteristic and producing a first signal;
  b. a second signal path having a relatively low gain characteristic relative to the gain characteristic in the first signal path, and a relatively high nonlinear distortion characteristic, relative to the nonlinear distortion characteristic in the first signal path, and producing a second signal;
  c. means for combining the first and second signals with opposite polarities, to produce a predetermined nonlinear transfer characteristic over a relatively wide bandwidth; and (2). an optical modulator.

2. A wide bandwidth circuit as claimed in claim 1, combined in cascade with a Mach-Zehnder interferometer modulator which has a transfer characteristic of a sine wave having a negative cubic distortion, and wherein the wide bandwidth circuit has a transfer characteristic having a positive cubic distortion which approximates an arc-sine function.

3. A wide bandwidth circuit as claimed in claim 1, wherein the wide bandwidth circuit amplifies larger amplitude signals more than smaller amplitude signals, and is combined in cascade with a circuit which amplifies smaller amplitude signals more than larger amplitude signals.

4. A wide bandwidth circuit as claimed in claim 1, wherein the combining means comprises a wide band differential amplifier for subtracting the first and second signals from the first and second paths to produce an output signal having a desired distortion characteristic.

5. A wide bandwidth circuit as claimed in claim 4, wherein the differential amplifier has a positive input terminal and a negative input terminal, the amplitude of the first signal at the positive input terminal is larger than the amplitude of the second signal at the negative input terminal, such that the overall gain of the circuit is positive, and the distortion at the second negative terminal is larger than the distortion at the first positive input terminal, such that the distortion at the output has an inverted sign.

6. A wide bandwidth circuit as claimed in claim 1, wherein the first low distortion path has a resistive attenuator, and the second lower gain distorting path has an attenuator with at least one diode shunting the signal to ground.

7. A wide bandwidth circuit as claimed in claim 6, wherein a compensating fixed capacitance and variable capacitance are added to the first path, wherein the fixed capacitance compensates for the junction capacitance of the diode at the nominal operating point, and the variable capacitance compensate for the voltage coefficient of the diode junction capacitance, whereby balancing the reactive components in the two signal paths produces a differential signal which maintains a desired nonlinearity over a broad frequency range.

8. A wide bandwidth circuit as claimed in claim 1, wherein the first low distortion path has a resistive attenuator and an amplifier, and the second lower gain distorting path has a resistive attenuator and an amplifier, and the first and second paths differ with respect to the relative positions of the attenuators with respect to the amplifiers and the attenuating powers of the attenuators.

* * * * *